(12) United States Patent
Ohmi et al.

(10) Patent No.: US 8,573,151 B2
(45) Date of Patent: Nov. 5, 2013

(54) MICROWAVE PLASMA PROCESSING APPARATUS, DIELECTRIC WINDOW FOR USE IN THE MICROWAVE PLASMA PROCESSING APPARATUS, AND METHOD FOR MANUFACTURING THE DIELECTRIC WINDOW

(75) Inventors: Tadahiro Ohmi, Sendai (JP); Masaki Hirayama, Sendai (JP); Tetsuya Goto, Sendai (JP); Yasuyuki Shirai, Sendai (JP); Masafumi Kitano, Sendai (JP); Kohei Watanuki, Sendai (JP); Takaaki Matsuoka, Tokyo (JP); Shigemi Murakawa, Chiba (JP)

(73) Assignees: Tokyo Electron Limited (JP); Tohoku University (JP)

( * ) Notice: Subject to any disclaimer, the term of this patent is extended or adjusted under 35 U.S.C. 154(b) by 749 days.

(21) Appl. No.: 12/393,724

(22) Filed: Feb. 26, 2009

(65) Prior Publication Data

US 2009/0218044 A1 Sep. 3, 2009

(30) Foreign Application Priority Data

Feb. 28, 2008 (JP) ................................ 2008-048063

(51) Int. Cl.
| | |
|---|---|
| C23C 16/00 | (2006.01) |
| C23F 1/00 | (2006.01) |
| H01L 21/306 | (2006.01) |
| B05D 5/06 | (2006.01) |
| B05D 3/02 | (2006.01) |

(52) U.S. Cl.
USPC ............. 118/723 MW; 156/345.41; 427/162; 427/376.2

(58) Field of Classification Search
USPC ............................ 118/723 MW; 156/345.41; 427/164–169, 452–454, 376.2, 397.7, 427/397.8; 428/141–145; 216/38
See application file for complete search history.

(56) References Cited

U.S. PATENT DOCUMENTS

| 5,599,624 A | * | 2/1997 | Prochazka ..................... 428/375 |
| 5,645,644 A | * | 7/1997 | Mabuchi et al. ...... 118/723 MW |

(Continued)

FOREIGN PATENT DOCUMENTS

| FR | 2870989 | * 12/2005 | ............. H01L 21/20 |
| JP | 2004-265919 | 9/2004 | |

(Continued)

OTHER PUBLICATIONS

Notice of Grounds of Rejection issued by Korean Intellectual Property Office on Oct. 21, 2010.

(Continued)

*Primary Examiner* — Rakesh Dhingra
(74) *Attorney, Agent, or Firm* — Cantor Colburn LLP

(57) ABSTRACT

A conventional microwave plasma processing apparatus, even when krypton (Kr) is used as a plasma-generation gas, can only obtain an oxide film or a nitride film having the same level of characteristics as those obtained when a rare gas such as argon (Ar) is used as a plasma-generation gas. Accordingly, instead of forming a dielectric window of a microwave plasma processing apparatus with only a ceramic member, a planarization film capable of obtaining a stoichiometric $SiO_2$ composition by thermal treatment is coated on one of a plurality of surfaces of the ceramic member, the surface facing a process space, and then thermally-treated, thereby forming a planarization insulation film having a very flat and dense surface. A corrosion-resistant film is formed on the planarization insulation film.

18 Claims, 4 Drawing Sheets

(56) References Cited

U.S. PATENT DOCUMENTS

| | | | |
|---|---|---|---|
| 6,027,792 A * | 2/2000 | Yamamoto et al. | 428/212 |
| 6,465,108 B1 * | 10/2002 | Kamitani et al. | 428/448 |
| 6,709,608 B2 * | 3/2004 | Gorczyca et al. | 216/39 |
| 2002/0037647 A1 * | 3/2002 | Hwang et al. | 438/689 |
| 2003/0091835 A1 * | 5/2003 | Takahashi et al. | 428/432 |
| 2004/0151839 A1 * | 8/2004 | Miyaji et al. | 427/446 |
| 2005/0211384 A1 * | 9/2005 | Hayashi | 156/345.47 |
| 2006/0037536 A1 * | 2/2006 | Kobayashi et al. | 118/715 |
| 2006/0189046 A1 * | 8/2006 | Song et al. | 438/149 |
| 2006/0238132 A1 | 10/2006 | Kitamura et al. | |
| 2007/0044716 A1 | 3/2007 | Tetsuka et al. | |
| 2007/0059491 A1 * | 3/2007 | Kawashima et al. | 428/141 |
| 2007/0113978 A1 | 5/2007 | Ishii et al. | |
| 2008/0032139 A1 * | 2/2008 | Le Blevennec et al. | 428/446 |
| 2009/0206348 A1 * | 8/2009 | Harle et al. | 257/80 |
| 2010/0175621 A1 * | 7/2010 | Yamazaki et al. | 118/723 AN |

FOREIGN PATENT DOCUMENTS

| | | | | |
|---|---|---|---|---|
| JP | 2005-097685 | | 4/2005 | |
| JP | 2006-310794 | | 11/2006 | |
| KR | 10-2002-0046972 | | 6/2002 | |
| KR | 10-2006-0128956 | | 12/2006 | |
| WO | WO 2007088904 | * | 8/2007 | H01H 1/46 |
| WO | WO 2007121735 | * | 11/2007 | H01L 21/18 |

OTHER PUBLICATIONS

Japanese Office Action—JP Application No. 2008-048063 issued Dec. 24, 2009.
Chinese Office Action—Chinese Patent Application No. 2009100076796 issued by the Chinese Patent Office on Feb. 23, 2011.
Chinese Office Action—CN Application No. 200910007679.6 dated Mar. 1, 2010.

* cited by examiner

MICROWAVE PLASMA PROCESSING APPARATUS, DIELECTRIC WINDOW FOR USE IN THE MICROWAVE PLASMA PROCESSING APPARATUS, AND METHOD FOR MANUFACTURING THE DIELECTRIC WINDOW

CROSS-REFERENCE TO RELATED PATENT APPLICATION

This application claims the benefit of Japanese Patent Application No. 2008-048063, filed on Feb. 28, 2008, in the Japan Patent Office, the disclosure of which is incorporated herein in its entirety by reference.

BACKGROUND OF THE INVENTION

1. Field of the Invention

The present invention relates to a microwave plasma processing apparatus which generates plasma by using microwaves passing through a dielectric plate and/or a shower plate and plasma-processes an object which is to be processed, and more particularly, to a ceramic member that forms a dielectric plate and/or a shower plate, and a method for manufacturing the ceramic member.

2. Description of the Related Art

A general microwave plasma processing apparatus includes a process chamber which performs processes such as film-formation, etching, ashing, and the like on an object to be processed, such as a glass substrate, a semiconductor substrate, or the like, by using plasma. A gas is introduced into the process chamber, and the microwave plasma processing apparatus uses a microwave introducing unit in order to supply microwaves to the process chamber, which is partitioned by a dielectric plate. For example, the microwave introducing unit may be a radial line slot antenna (RLSA) (hereinafter, referred to as a slot antenna). The microwaves excite the gas and thus plasma is generated in the process chamber. In the microwave plasma processing apparatus, a holding stage on which an object to be processed, such as a glass substrate, a semiconductor substrate, or the like, is held, is disposed in the process chamber so as to face the dielectric plate.

The dielectric plate constitutes a window which maintains a processing space of the process chamber to be airtight and through which microwaves are supplied into the processing space of the process chamber.

Such a general microwave plasma processing apparatus has a structure having only a dielectric window formed by a dielectric plate or a structure having a shower plate as a part of dielectric window.

A plasma processing apparatus disclosed in Japanese Patent Laid-open Publication No. 2004-265919 (Reference 1) has the former structure in which a dielectric plate is formed in a process chamber so as to face a slot antenna, and thus a processing space where plasma processing occurs is maintained airtight by the dielectric plate. In this plasma processing apparatus, microwaves from the slot antenna are supplied into the processing space via a dielectric window formed by the dielectric plate. In this case, a plasma gas such as argon (Ar) is injected between the dielectric plate and a holding stage, that is, the plasma gas is supplied from the dielectric plate down into the processing space.

Japanese Patent Laid-open Publication No. 2006-310794 (Reference 2) discloses a plasma processing apparatus and method in which a plurality of dielectric plates through which microwaves are transmitted are paved in a tile configuration and a plasma-generation gas such as Ar is supplied from spaces between the dielectric plates into a process chamber. A dielectric plate in Reference 2 includes a plurality of dielectric parts.

The microwave plasma processing apparatus having the latter structure, that is, a structure having a shower plate as a dielectric window, includes a circular slot antenna and a circular shower plate that includes a plurality of holes through which a plasma gas such as Ar passes. The shower plate is formed by a dielectric member. Further, a microwave plasma processing apparatus having two shower plates formed one over another has also been proposed.

A dielectric window used as a dielectric plate, dielectric parts, or a shower plate as described above is typically formed of ceramic, such as alumina ceramic.

Hereinafter, a dielectric member such as a dielectric plate, dielectric parts, or a dielectric window including a shower plate, is referred to as a dielectric window.

It is reported that a general microwave plasma processing apparatus described above can form a better film, for example, a better oxide film, when using krypton (Kr) as a plasma-generation gas than when using Ar as the plasma-generation gas.

SUMMARY OF THE INVENTION

However, in practice, it has been proved that even when Kr is used as a plasma-generation gas in some microwave plasma processing apparatuses, an oxide film having the same characteristics can only be obtained as an oxide film obtained when Ar is used as a plasma-generation gas. More specifically, in a general microwave plasma processing apparatus typically, a mixture of argon and oxygen ($Ar/O_2$) as a plasma-generation gas is typically used, but even when a mixture of krypton and oxygen ($Kr/O_2$) is used as a plasma-generation gas, a significant difference is not obtained in some general microwave plasma processing apparatuses. Even when a nitride film is formed by replacing $Ar/NH_3$ with $Kr/NH_3$, a significant difference is not obtained.

Therefore, an object of the present invention is to investigate a cause of degradation of the characteristics of a film, particularly, an oxide film or a nitride film, formed by a general microwave plasma processing apparatus, to propose a unit for removing the investigated cause, and improve the characteristics of the formed film by removing the cause.

Theoretically, a better oxide film should be formed when using Kr plasma than when using Ar plasma. However, in practice, even when Kr plasma is used, only an oxide film of the same quality as an oxide film formed when Ar plasma is used is obtained. According to a review of the inventors of the present invention, one cause of this problem is inactivation of an oxygen radical formed by plasma due to waste of the oxygen radical on a surface of a ceramic plate that constitutes a dielectric member. More specifically, high-density plasma can be generated more easily when Kr plasma is used than when Ar plasma is used, and thus the Kr plasma exists in a location close to a dielectric window compared to the Ar plasma. Consequently, the Kr plasma is prone to be affected by the surface of the dielectric window. Although the surface of the dielectric window is planarized by polishing, it has been observed that the surface of the dielectric window, which is formed of alumina ceramic, has irregularities with a peak-to-valley (P-V) of 2 μm, which is large in terms of micron dimensions. As described above, since the irregularities of the surface of the alumina ceramic dielectric window are large, plasma has been proved to disappear due to recombination of plasma ions.

Another cause is that since the surface of the alumina ceramic dielectric window has a lack of oxygen due to the polishing, the oxygen radicals are used during oxidation of the surface, and thus do not remain to be used for primary processing.

The inventors of the present invention have devised how to improve the dielectric window, based on the above-described causes.

According to the present invention, a surface of a ceramic member (that is, a surface on the side of a process chamber) of a dielectric window, which faces plasma, is planarized by a planarization film and formed to have a stoichiometric composition, that is, formed of a complete oxide, thereby obtaining a film having desired characteristics.

For example, a microwave plasma processing apparatus for a frequency of 2.45 GHz or 915 MHz including a shower plate formed by covering the surface of a ceramic member such as an alumina ceramic member with a planarization film is obtained.

The present invention is applicable to not only microwave plasma processing apparatuses including a shower plate as a dielectric window but also microwave plasma processing apparatuses including dielectric windows having other forms.

However, when $SiO_2$ is used to form the planarization film, since $SiO_2$ has a low corrosion resistance to a carbon fluoride (CF) gas which is used during chemical vapor deposition (CVD) of a CF film or plasma etching, the $SiO_2$ film may be covered with a corrosion-resistant insulation film such as a $Y_2O_3$ film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
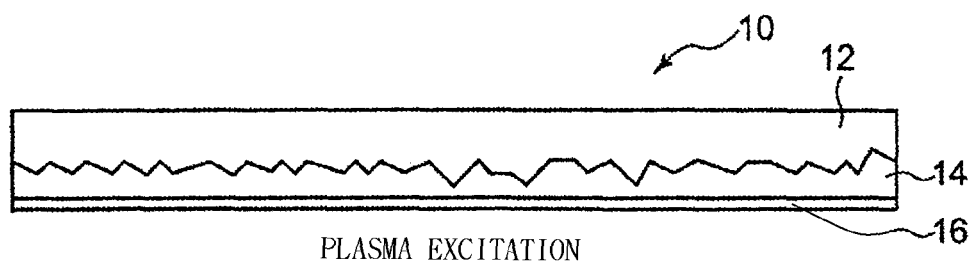
FIG. 1 is a cross-sectional view of a dielectric window according to an embodiment of the present invention.

The present invention will now be described more fully with reference to the accompanying drawings, in which exemplary embodiments of the invention are shown. FIG. 1 is a cross-sectional view of a dielectric window 10 for use in a microwave plasma processing apparatus, according to an embodiment of the present invention. Referring to FIG. 1, the dielectric window 10 according to the current embodiment of the present invention includes a ceramic member 12 formed of alumina ($Al_2O_3$), a planarization insulation film 14 formed on one surface (here, a surface on the side of a processing space) of the ceramic member 12, and a corrosion-resistant film (here, a $Y_2O_3$ film) 16 formed on the planarization insulation film 14. In this structure, as illustrated in FIG. 1, the corrosion-resistant film 16 faces a plasma excitation space, that is, the processing space.

One of a plurality of surfaces of the alumina ceramic member 12 that result from cutting and polishing, that is, the surface of the alumina ceramic member 12 on the side of the processing space, has irregularities with a peak-to-valley (P-V) height of 1.78 μm and an average roughness (Ra) of 0.232 μm.

The planarization insulation film 14 is formed on the surface of the ceramic member 12 on the side of the processing space. The planarization insulation film 14 may be formed of a SiCO coating film which contains Si, C, and, O in an atomic ratio of O>Si>½C.

More specifically, the SiCO coating film, whose backbone is an SiO repeating unit, may be formed of an oxide of a single type or oxides of at least two types to have a composition expressed as a general formula of $((CH_3)_n SiO_{2-n/2})_x (SiO_2)_{1-x}$ (where n=1~3 and x≤1). SiCO liquid including the oxide expressed in the aforementioned formula is coated on the ceramic member 12 and dried to be baked, thereby obtaining a silicon oxide ($SiO_2$) film having a stoichiometrical composition.

In a method of forming a $SiO_2$ film from SiCO material, first, the ceramic member 12 is rotated at 600 rpm and then the SiCO material is coated for 30 seconds on the rotating ceramic member 12. Then, the SiCO material is pre-baked for 5 minutes at a temperature of 130° C. in a 20% $O_2$/80% $N_2$ atmosphere, heated up to 400° C. at a rate of 5° C./min, heated up to 900° C. at a rate of 2° C./min in a nitrogen atmosphere, and maintained for an hour at 900° C. in a 10% $H_2O$/90% $O_2$ atmosphere, thereby obtaining a $SiO_2$ film having a stoichiometrical $SiO_2$ composition from the SiCO.

As described above, the surface of the $SiO_2$ film having a stoichiometrical composition, that is, the planarization insulation film 14, has a surface roughness of 0.9 μm as a P-V height and 0.139 μm as Ra, and is thus flat compared with the surface roughness of the ceramic member 12.

In the dielectric window 10 of FIG. 1, a $Y_2O_3$ film with a thickness of 0.3 μm is formed as the corrosion-resistant film 16 on the $SiO_2$ planarization insulation film 14 by coating, drying, and baking $Y_2O_3$ on the $SiO_2$ planarization insulation film 14. It has been verified that the $Y_2O_3$ film formed as described above as the corrosion-resistant film 16 has a smaller surface roughness than the surface roughness of the $SiO_2$ film and is highly dense and voidless.

Since the dielectric window 10 having a flat surface has a small effective surface area, the dielectric window 10 can reduce the amount of recombination of electrons and ions. To this end, a high plasma density can be obtained with high power efficiency.

It has been verified that, when the dielectric window 10 is used as a dielectric plate, a tile-shaped dielectric part, a shower plate, or the like in a microwave plasma processing apparatus, an oxide film and a nitride film which have good characteristics can be formed. In particular, when krypton (Kr) plasma is used, an oxide film and a nitride film which have good characteristics could be formed.

A microwave plasma processing apparatus including the dielectric window 10 will now be described.

Figure 2:
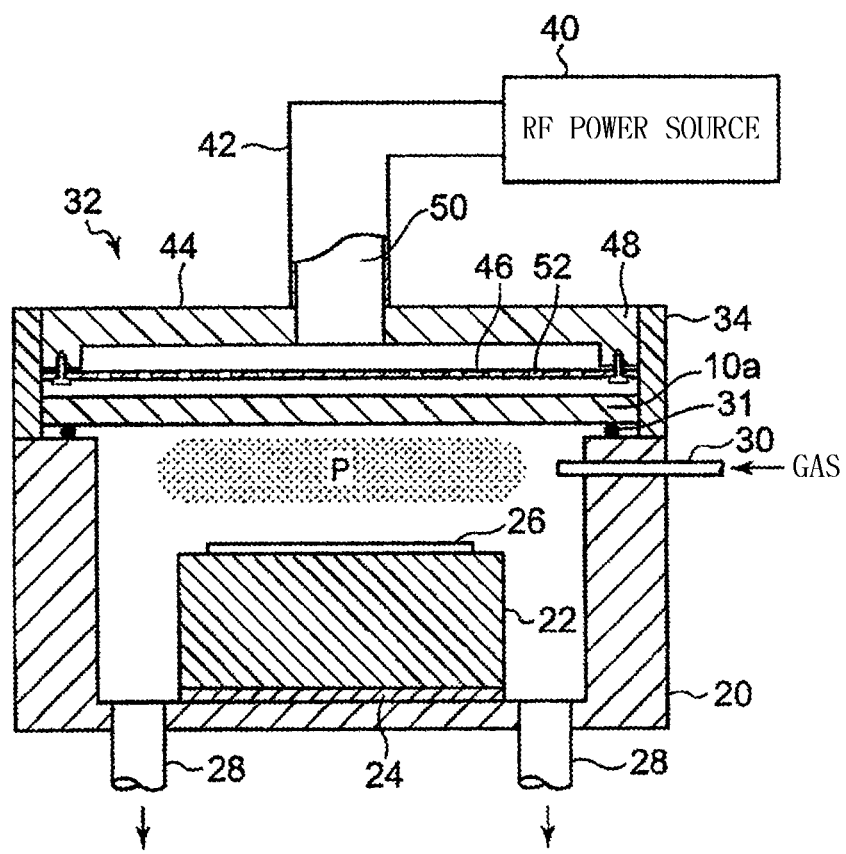
FIG. 2 is a schematic diagram of a microwave plasma processing apparatus using the dielectric window illustrated in FIG. 1, according to an embodiment of the present invention.

FIG. 2 illustrates a microwave plasma processing apparatus using the dielectric window 10 as a dielectric plate 10a, according to an embodiment of the present invention. Referring to FIG. 2, the microwave plasma processing apparatus according to the present embodiment includes a process chamber 20 having a cylindrical shape, and a holding stage 22 formed in a central lower part of the process chamber 20. The process chamber 20 is insulated from the holding stage 22 by an insulation plate 24. A substrate 26, such as a semiconductor substrate or a glass substrate, is held as an object to be processed, onto an upper surface of the holding stage 22. Exhaust ports 28 for exhausting air from the process chamber 20 are formed on the periphery of a bottom surface of the process chamber 20.

A gas inlet 30 for injecting gas into the process chamber 20 is formed in a sidewall of the process chamber 20. Accordingly, plasma-generation gas, such as argon (Ar), Kr, or the like, is injected into the process chamber 20 through the gas inlet 30.

The dielectric plate 10a shown in FIG. 1, serving as the dielectric window 10, is disposed over to cover an opening of the process chamber 20. The dielectric plate 10a divides the process chamber 20 into a process space corresponding to a lower part of FIG. 2 and a microwave-applying space corresponding to an upper part of FIG. 2. A sealing member 31, such as an O ring, is disposed between the dielectric plate 10a and the process chamber 20. Accordingly, the process space, which is enclosed by the process chamber 20 and the dielectric plate 10a, is maintained to be airtight.

A radial line slot antenna (RLSA) (that is, a slot antenna) 32 for supplying microwaves into the process chamber 20 is disposed on the dielectric plate 10a serving as the dielectric window 10. The slot antenna 32 is separated from the process space of the process chamber 20 by the dielectric plate 10a serving as the dielectric window 10. Consequently, the slot antenna 32 is protected from plasma by the dielectric plate 10a.

A shield member 34 is disposed on an upper surface of the process chamber 20, in a ring shape around the sidewall thereof. In other words, the shield member 34 is installed on outer peripheries of the dielectric plate 10a and the slot antenna 32. This structure may prevent radio frequency (RF) electromagnetic fields supplied from the slot antenna 32 into the process chamber 20 from leaking out of the process chamber 20.

The slot antenna 32 is connected to an RF power source 40, which generates, for example, an RF electromagnetic field of 2.45 GHz, via a waveguide 42.

The slot antenna 32 includes two circular conductive plates 44 and 46 parallel to each other, and a conductive ring 48 which connects output peripheries of the circular conductive plates 44 and 46 to each other so as to shield the circular conductive plates 44 and 46. The circular conductive plates 44 and 46 define a radial waveguide between themselves.

An opening 50 connected to the waveguide 42 is formed in a center of the conductive plate 44 over the radial waveguide, and RF electromagnetic fields generated by the RF power source 40 are supplied into the radial waveguide via the opening 50. The conductive plate 46, which is located below the radial waveguide, includes a plurality of slots 52 for supplying the RF electromagnetic fields propagating within the radial waveguide into the process chamber 20 via the dielectric plate 10a. Since the slot antenna 32 is formed by the slots 52, the conductive plate 46 in which the slots 52 are formed is referred to as an antenna surface of the slot antenna 32.

In this structure, the process chamber 20 may be blocked by the dielectric plate 10a so as to prevent plasma P generated within the process chamber 20 from leaking, thereby protecting the slot antenna 32 from the plasma P. The dielectric plate 10a is formed of the dielectric window 10 of FIG. 1. However, the $Y_2O_3$ corrosion-resistant film 16 (that is, an yttria film) may be omitted from the dielectric plate 10a.

According to an experiment, the microwave plasma processing apparatus of FIG. 2 could form a better oxide film when plasma was generated from $Kr/O_2$ than when $Ar/O_2$ plasma was used.

Figure 3:
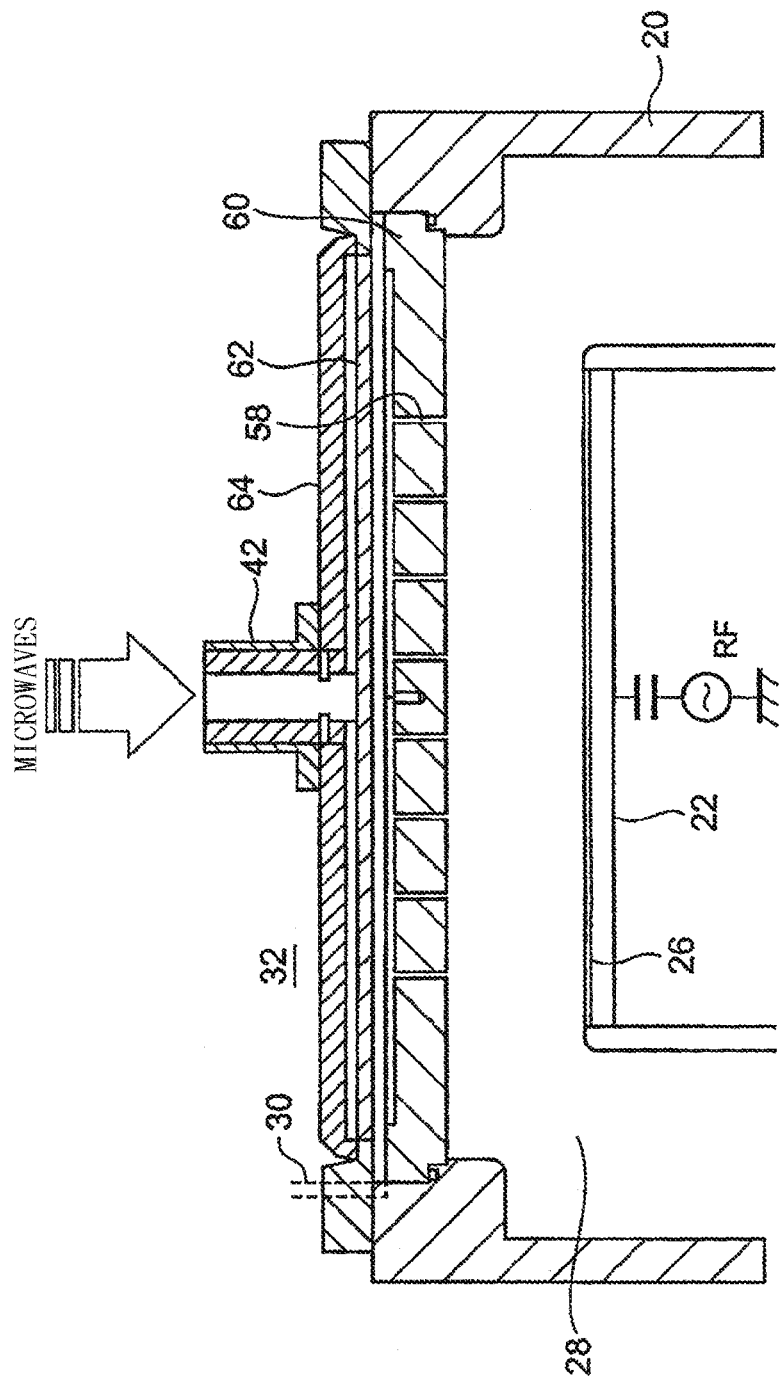
FIG. 3 is a schematic diagram of a microwave plasma processing apparatus using the dielectric window illustrated in FIG. 1, according to another embodiment of the present invention.

FIG. 3 is a schematic diagram of a microwave plasma processing apparatus using the dielectric window 10 as a shower plate 60, according to another embodiment of the present invention. Referring to FIG. 3, microwaves are supplied into the process chamber 20 via the waveguide 42 and an RLSA 64 disposed over the process chamber 20. More specifically, a cover plate 62 and the shower plate 60 are formed under the RLSA 64 such as to be apart from each other, and the microwaves from the RLSA 64 penetrate through the cover plate 62 and the shower plate 60 and are radiated to a plasma-generation area within the process chamber 20.

The shower plate 60 has the same structure as the dielectric window 10 of FIG. 1, and has a plurality of holes 58 through which a plasma-generation gas is transmitted. The diameter of each of the holes 58 may be equal to or less than 50 μm. A planarization insulation film may also be formed on an inner surface of each of the holes 58. At least one of a porous body and a member having one or a plurality of gas-passing holes having smaller diameters than the diameter of each of the holes 58 may be inserted into each of the holes 58.

A plasma-generation gas for generating plasma is injected into the shower plate 60 via a gas inlet 30. A rare gas, such as Kr gas, Ar gas, or xenon (Xe) gas, as the plasma-generation gas is uniformly spurt from the shower plate 60 into the plasma-generation area, and the plasma-generation gas is excited in the plasma-generation area by the microwaves radiated into the plasma-generation area, thereby forming a plasma.

In the current embodiment, the shower plate 60 includes only a $SiO_2$ film as the planarization insulation film and does not include an $Y_2O_3$ film. In this structure, a $Kr/O_2$ gas was injected into the process chamber 20 via the holes 58 of the shower plate 60, and thus an improved $SiO_2$ film is formed on the surface of a silicon substrate 26.

Figure 4:
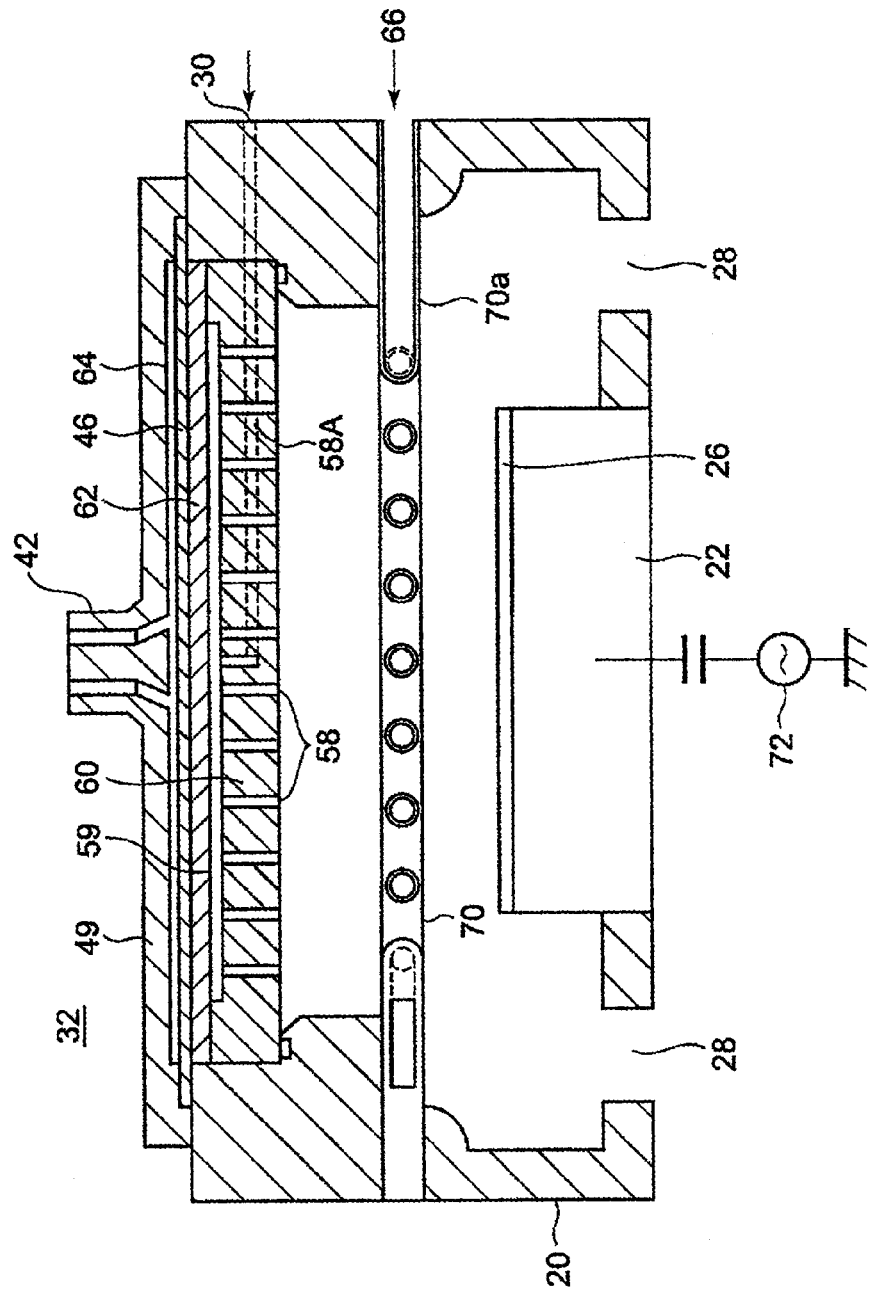
FIG. 4 is a schematic diagram of a microwave plasma processing apparatus using the dielectric window illustrated in FIG. 1, according to another embodiment of the present invention.

FIG. 4 is a schematic diagram of a microwave plasma processing apparatus that uses the dielectric window 10 illustrated in FIG. 1, according to another embodiment of the present invention. Referring to FIG. 4, the microwave plasma processing apparatus according to the present embodiment is obtained by further including a shower plate 70 for supplying a processing gas in addition to the shower plate 60 of FIG. 3. Hereinafter, the shower plates 60 and 70 are referred to as an upper shower plate 60 and a lower shower plate 70, respectively.

More specifically, the microwave plasma processing apparatus of FIG. 4 includes a process chamber 20, and a holding stage 22 which is formed of AlN or $Al_2O_3$ within the process chamber 20 and holds to-be-processed substrate 26 by using an electrostatic chuck. The holding stage 22 may be formed using a Hot Isostatic Press (HIP) technique. Exhaust ports 28 are formed in at least two, and more preferably at least three areas of a portion of the process chamber 20 that surrounds the holding stage 22. The exhaust ports 28 are arranged to be same intervals with respect to each other on the portion of the process chamber 20 that surrounds the holding stage 22, that is, so as to be approximately symmetrical to each other with respect to the axis of the to-be-processed substrate 26 on the holding stage 22. Air is exhausted from the process chamber 20 via the exhaust ports 28 by a screw pump or the like, and thus a pressure of the process chamber 20 is reduced.

The process chamber 20 may be formed of an Al alloy composed mainly of Al, and has an inner wall which includes a flawless oxide aluminum coating constituting a first coating layer which is formed by anodization using an electrolyte solution composed of an organic chemical solution, and an oxide yttrium film constituting a second coating layer which is formed on the oxide aluminum coating by plasma spraying.

The upper shower plate 60 having a plurality of nozzles 58 is disposed to face the to-be-processed substrate 26, and has the same structure as the dielectric window 10. The upper shower plate 60 forms a part of the inner wall of the process chamber 20 and includes a plurality of nozzles in the dielectric window 10 having a disk shape.

A cover plate 62 is provided over the upper shower plate 60 by sealing. A plasma gas path 59 leading to the nozzles 58 is formed on a side of the upper shower plate 60, which faces the cover plate 62. The plasma gas path 59 is formed between the upper shower plate 60 and the cover plate 62 and also leads to a plasma gas path 58A connected to a plasma gas inlet 30 formed in an outer wall of the process chamber 20.

The upper shower plate 60 is supported by a protrusion formed on the inner wall of the process chamber 20. A portion of the protrusion, which supports the upper shower plate 60, is rounded in order to prevent abnormal discharge.

In this structure, a plasma gas such as Ar or Kr injected via the plasma gas inlet 30 sequentially passes through the plasma gas paths 58A and 59 within the upper shower plate 60, and is then consistently supplied to a space below the upper shower plate 60 via the nozzles 58.

A conductive plate 46 with a disk shape having a plurality of slots is formed on the cover plate 62 so as to contact the cover plate 62, and thus forms a part of a slot antenna 32. The slot antenna 32 includes a conductive plate 49 which constitutes a main body of the slot antenna 32, and a wavelength-shortening plate 64 formed of a low-loss dielectric material such as $Al_2O_3$, $SiO_2$, or $Si_3N_4$ between the conductive plates 46 and 49.

The slot antenna 32 is installed on the process chamber 20 by sealing. Microwaves having a frequency of 2.45 GHz or 8.3 GHz are supplied from an external microwave source (not shown) to the slot antenna 32 via a waveguide 42. The supplied microwaves are radiated from the slots of the conductive plate 46 into the process chamber 20 via the cover plate 62 and the upper shower plate 60. Thus, within the space below the upper shower plate 60, plasma is generated when the microwaves excite the plasma gas supplied from the nozzles 58.

Since the upper shower plate 60 has no irregularities and is very flat, the upper shower plate 60 serves as an effective microwave transmission window.

In the microwave plasma processing apparatus of FIG. 4, the lower shower plate 70, to which a process gas is supplied from a process gas inlet 66 formed in the outer wall of the process chamber 20, is installed between the upper shower plate 60 and the to-be-processed substrate 26 on the holding stage 22. The lower shower plate 70 includes a lattice-shaped process gas path 70a for a process gas which is emitted via a plurality of process gas nozzles.

In a space between the lower shower plate 70 and the to-be-processed substrate 26, uniform substrate processing is performed. Examples of the substrate processing include plasma oxidation, plasma nitridation, plasma oxynitridation, plasma chemical vapor deposition (CVD), and the like. A fluorocarbon gas that is easily dissociated, such as $C_4F_8$, $C_5F_8$, or $C_4F_6$, or an etching gas such as an F-based gas or a Cl-based gas is supplied as a gas supplied from the lower shower plate 70 to the space between the lower shower plate 70 and the to-be-processed substrate 26. Reactive ion etching may be performed on the to-be-processed substrate 26 by applying an RF voltage from an RF power source 72 to the holding stage 22.

In the embodiment of FIG. 4, a process gas such as a $C_xF_y$ gas (for example, $C_5F_8$, $C_4F_8$, or the like) is injected into a diffusion plasma area formed below the lower shower plate 70, via the process gas inlet 66. As such, a fluorocarbon film or the like may be formed on a silicon substrate 26 by supplying the process gas to the diffusion plasma area.

Referring to FIG. 4, like the inner wall of the process chamber 20, the lower shower plate 70 (that is, a process gas supply structure) includes an alloy basic metal composed mainly of Al, an oxide aluminum protection film constituting a first coating layer is formed on the alloy basic metal by such anodization as that used in the above-described formation of the first coating layer of the inner wall of the process chamber 20, and an oxide yttrium film constituting a second coating layer is formed on the oxide aluminum protection film. A process gas supply port of the lattice-shaped process gas path 70a is connected to the process gas inlet 66 and uniformly emits the process gas to the space via the process gas nozzles (not shown) formed on the bottom surface of the lattice-shaped process gas path 70a. In the lower shower plate 70, an aperture (not shown) through which plasma or a process gas included in the plasma passes is formed in a portion between adjacent lattice-shaped process gas paths 70a.

As the ceramic member 12 of the dielectric window 10 illustrated in FIG. 1, the upper shower plate 60 is covered by a planarization insulation film and a corrosion-resistant film (for example, an $Y_2O_3$ film) and thus has a very flat surface.

Although the dielectric window 10 of FIG. 1 is used as a dielectric plate or an upper shower plate of a microwave plasma processing apparatus in the above embodiments, the present invention is not limited thereto. For example, the present invention is also applicable to microwave plasma processing apparatuses including a plurality of dielectric parts (that is, a plurality of tile-shaped members) in order to transmit microwaves.

According to the present invention, a dielectric window for use in microwave plasma processing apparatuses is obtained by covering a surface facing plasma from surfaces of a ceramic member with a planarization film, and the surface of the planarization film is formed to be a complete oxide film, thereby preventing extinction of radicals. Therefore, the characteristics of a microwave plasma processing apparatus when Kr is used as a plasma-generation gas may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A microwave plasma processing apparatus comprising:
   a process chamber defining a process space in which an object can be plasma-processed;
   a gas supply unit for supplying a predetermined gas into the process chamber;
   an antenna for supplying microwaves into the process chamber; and
   a dielectric window which maintains the process chamber to be airtight and propagates the microwaves supplied through the antenna,
   wherein:
   the dielectric window comprises a ceramic member of which surface has irregularities, the irregularities being represented as a peak-to-valley value, the ceramic member being formed of alumina; and
   a planarization insulation film formed on the surface of the ceramic member and planarizing the surface of the ceramic member by filling up the irregularities, the planarization insulation film facing the process space;
wherein the planarization insulation film is formed by baking a SiO containing film.

2. The microwave plasma processing apparatus of claim 1, wherein the planarization insulation film comprises a plurality of films.

3. The microwave plasma processing apparatus of claim 1, wherein a $Y_2O_3$ film which is corrosion-resistant film is formed on the planarization insulation film.

4. The microwave plasma processing apparatus of claim 1, wherein the ceramic member comprises a plurality of tile-shaped members.

5. The microwave plasma processing apparatus of claim 1, wherein the microwaves have a frequency of 2.45 GHz or 915 MHz.

6. The microwave plasma processing apparatus of claim 1, wherein the planarization insulation film is obtained by baking a SiCO film which contains Si, C, and, O, the SiCO film having an atomic ratio of $0 > Si > \frac{1}{2}C$.

7. The microwave plasma processing apparatus of claim 6, wherein the SiCO film, whose backbone is an SiO repeating unit, comprises an oxide of a single type or oxides of at least two types so as to have a composition expressed as a general formula of $((CH_3)_n SiO_{2-n/2})_x (SiO_2)_{1-x}$ where n=1~3 and x≤1.

8. The microwave plasma processing apparatus of claim 1, wherein the planarization insulation film comprises a $SiO_2$ film.

9. The microwave plasma processing apparatus of claim 8, wherein the $SiO_2$ film is thicker than a roughness of the surface of the ceramic member, wherein the roughness is represented as a peak-to-valley value.

10. The microwave plasma processing apparatus of claim 9, wherein the thickness of the $SiO_2$ film is in the range of 1 μm to 5 μm.

11. A dielectric window which is used in microwave plasma processing apparatuses and transmits microwaves, the dielectric window comprising:

a ceramic member of which surface has irregularities, the irregularities being represented as a peak-to-valley value, the ceramic member being formed of alumina; and a planarization insulation film formed on the surface of the ceramic member and planarizing the surface of the ceramic member by filling up the irregularities, the planarization insulation film facing a plasma processing space in the plasma processing apparatuses;

wherein the planarization insulation film is formed by baking an SiO containing film.

12. The dielectric window of claim 11, further comprising a corrosion-resistant film formed on the planarization insulation film, wherein the corrosion-resistant film is a $Y_2O_3$ film.

13. The dielectric window of claim 11, wherein the planarization insulation film is obtained by baking a SiCO film which contains Si, C, and, O, the SiCO film having an atomic ratio of $0 > Si > \frac{1}{2}C$.

14. The dielectric window of claim 13, wherein the SiCO film, whose backbone is an SiO repeating unit, comprises an oxide of a single type or oxides of at least two types so as to have a composition expressed as a general formula of $((CH_3)_n SiO_{2-n/2})_x (SiO_2)_{1-x}$ where n=1~3 and x≤1.

15. A method of manufacturing an electronic device, the method using a microwave plasma processing apparatus of claim 1.

16. The dielectric window of claim 11, wherein the planarization insulation film comprises a plurality of films.

17. The dielectric window of claim 11, wherein the planarization insulation film comprises a $SiO_2$ film.

18. The dielectric window of claim 17, wherein the $SiO_2$ film is thicker than a roughness of the surface of the ceramic member, wherein the roughness is represented as a peak-to-valley value.

* * * * *